United States Patent [19]

Cooke et al.

[11] Patent Number: 5,004,866
[45] Date of Patent: Apr. 2, 1991

[54] SELF-CONTAINED GROUNDING STRIP

[75] Inventors: Kevin K. Cooke, Delray Beach; John R. Dewitt, Boca Raton; Paul J. Galinis, Boynton Beach; Walter B. Koteff, Boca Raton, all of Fla.

[73] Assignee: International Business Machines Corp., Armonk, N.Y.

[21] Appl. No.: 428,140

[22] Filed: Oct. 27, 1989

[51] Int. Cl.$^5$ .............................................. H05K 9/00
[52] U.S. Cl. .......................... 174/35 GC; 174/35 MS
[58] Field of Search .......... 174/35 R, 35 MS, 35 GC, 174/51; 361/428, 424; 219/10.55 D, 10.55 R

[56] References Cited

U.S. PATENT DOCUMENTS 4,750,569  6/1988  Flogaus ........................... 174/35 MS

FOREIGN PATENT DOCUMENTS 2601277  7/1976  Fed. Rep. of Germany .

Primary Examiner—Leo P. Picard
Assistant Examiner—Bot L. Ledynh
Attorney, Agent, or Firm—Winfield J. Brown, Jr.; Stephen A. Terrile

[57] ABSTRACT

An apparatus for electromagnetically shielding electronic equipment has a first and second spaced apart housing members having a gap between them. A rigid member having a plurality of openings is interposed between them. A spring member connected to the rigid member has a plurality of spring fingers extending through openings in the rigid member. A cover member has a cam which forces the first housing member against one side of the spring member to extend the spring finger into the second housing member in order to cause an electrical connection between the first and second housing members.

10 Claims, 11 Drawing Sheets

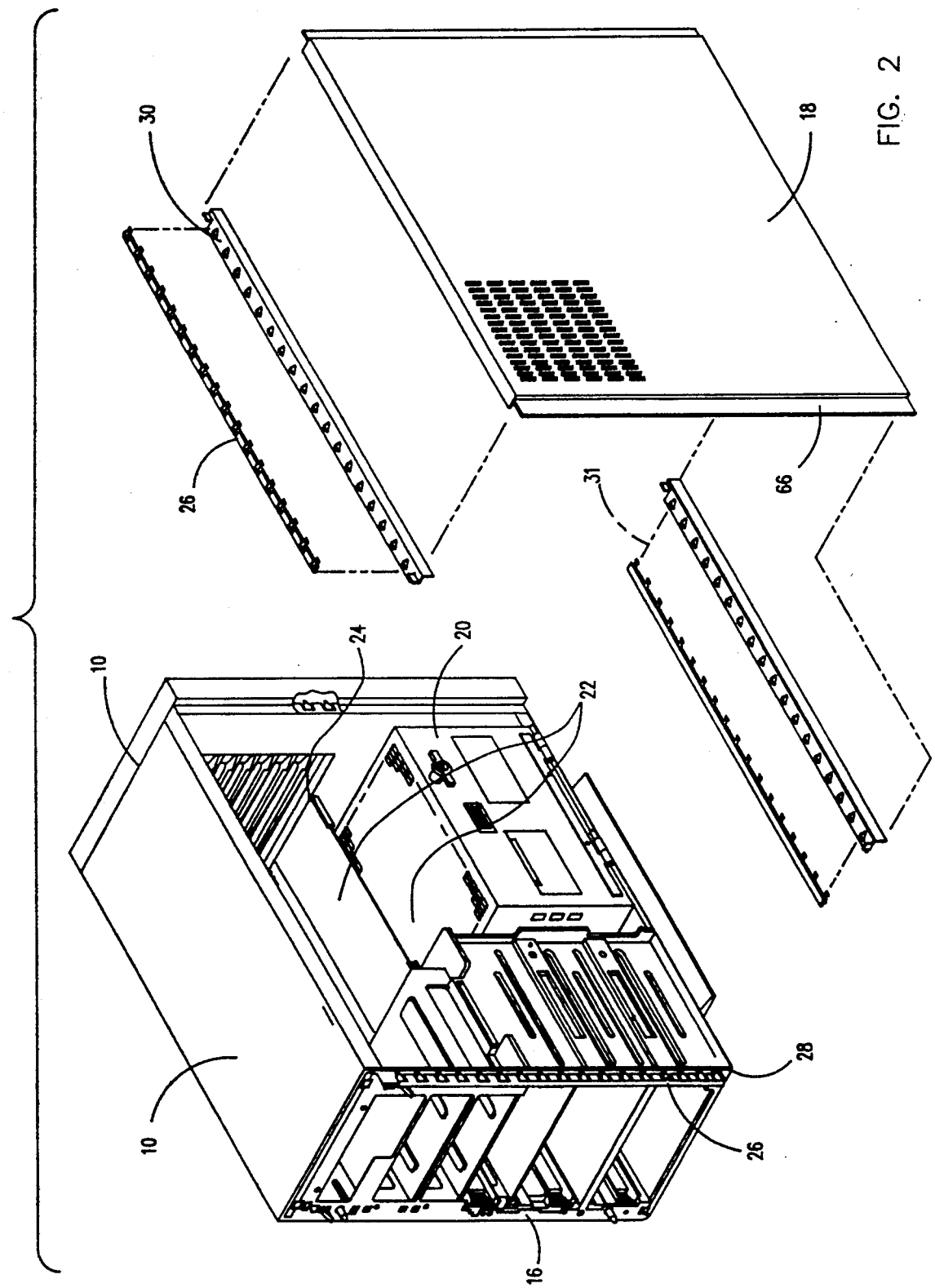

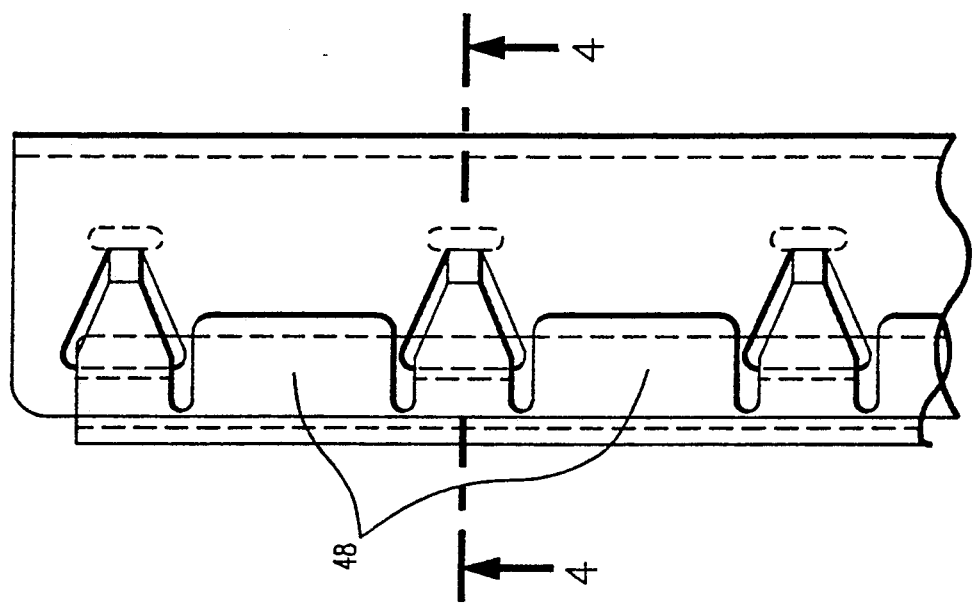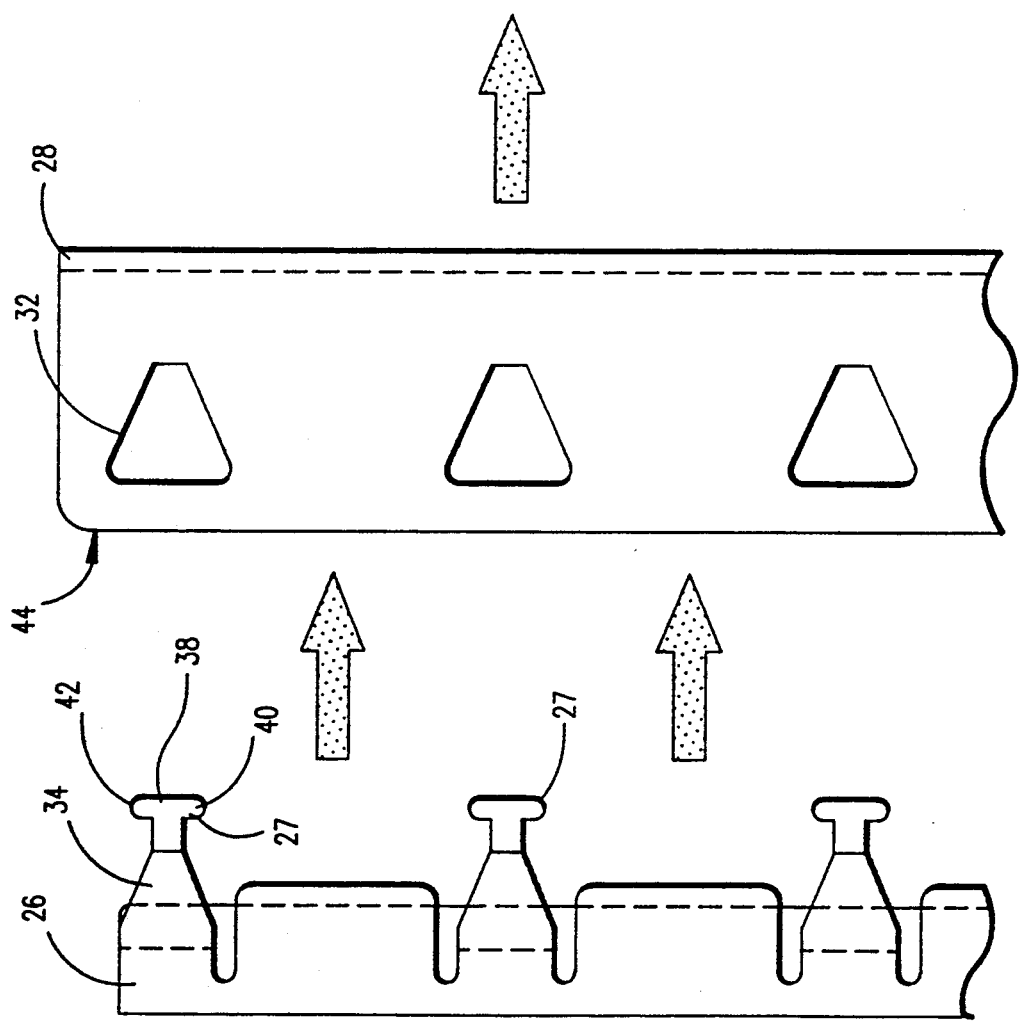

SELF-CONTAINED GROUNDING STRIP

FIELD OF THE INVENTION

This invention relates generally to electromagnetic interference (EMI) gaskets and, more specifically, to a particular configuration for an EMI grounding spring used to provide electrical grounding for a separable machine cover for a personal computer system.

BACKGROUND DISCUSSION

Personal computer systems in general and IBM personal computers in particular have obtained widespread use for providing computer power to many segments of today's modern society. Personal computer systems can usually be defined as a desk top, floor standing, or portable microcomputer that consist of a system unit having a single system processor, a display monitor, a keyboard, one or more diskette drives, a fixed disk storage, and an optional printer. These components are usually housed within a metal enclosure, having separable covers. One of the problems with separable covers is the leakage of electromagnetic signals that are radiated or conducted by the electronic equipment inside. This electromagnetic interference (EMI) causes performance reduction to neighboring electronic equipment.

Electromagnetic compatibility (EMC) is the ability of the electronic equipment to perform without suffering or causing performance degradation due to electromagnetic absorption or electromagnetic emissions to its operational environment. Because the trend in personal computer systems is pushing towards faster and higher frequency devices, and therefore higher magnitudes of EMI, the design standards to accomplish acceptable EMC criteria continues to increase. Due to this increasing concern, the Federal Communications Commission (FCC), among other overseas organizations, have set, and are enforcing, regulations to help maintain a clean electronic environment.

In the design of an electronic device such as a personal computer system, to maintain this EMC criteria, it is absolutely necessary to shield the critical inner components with a sealed enclosure of highly conductive material. However, typical of most electronic devices, their packaging incorporates removable covers which, subsequently, creates joints that corrupt the machine seal as well as its EMC integrity. Through studies, it has become known that to maintain the EMC at these joints, conductive contact between the cover and the base enclosure must be made along the entire joint at distances no more than 1/20 of a signal's wavelength. Typically, in today's personal computer systems, this distance is approximately 1 inch.

To overcome this design obstacle, industry has approached this problem with a variety of mechanical fasteners and spring devices. The most reliable, however, the most impractical and expensive, would be a series of screws along the parameter of the joint. This would ensure the required contact but would cause unnecessary hardship to the customer during removal/installation of the covers. The most typical solution used by industry is through the use of finger stock strips or gaskets stamped from highly conductive material. These strips would normally be welded at the joint to a mating edge of the cover or base enclosure and achieve contact through fingers when the covers assembled. Functionally these meet the requirements, however, when the joint is exposed with the cover off, the spring fingers are susceptible to damage and deformation through exposure to the customer. In addition, because the strips are extremely thin to allow for flexibility, they create unsafe conditions for the customer by exposing sharp edges.

SUMMARY OF THE INVENTION

The present invention has been developed for the purpose of alleviating the above mentioned problems. Accordingly, the invention has as one of its objects an apparatus and method for providing EMC shielding along the exposed joints for a separable cover.

Another object of the present invention is to provide an apparatus and method for providing EMC grounding at exposed joints between an electronic device's base enclosure and its removable cover while in its closed position.

Yet another objective of the present invention is to provide in a reliable manner EMC shielding contacts which provide minimal exposure to the customer.

Another objective of the present invention is to provide control cover installation and cover alignment through the consistent spring force of a contained non-deformable contact strip.

The electromagnetic device for shielding electronic equipment of the present invention comprises a first and second housing member having a gap between them, a relatively rigid member interposed between the first and second housing members, and a contact spring attached to the edge of the rigid member. The relatively rigid member is interposed between the first and second housing members wherein the outer surface of the rigid member is opposed to the first housing and the inner surface of the rigid member is opposed the second housing. The rigid member has a plurality of openings adjacent its edge. A contact spring member is attached to the edge of the rigid member. The contact spring member has a plurality of individual spring fingers. Each spring finger has a first surface extending away from the outer surface of the rigid member and extends into a second surface extending through an opening of the rigid member and to a position against the inner surface of the rigid member. A cover member, enclosing a portion of the first member, includes a camming means which forces the first member towards the second member to close the gap. During this interaction the first member contacts the first surface of each individual spring finger to force the second surface of the spring finger away from the inner surface of the rigid member and into the second housing member to create an electrical connection between the first and second housing members. Since the spring fingers are retracted against the inner surface of the rigid member when the cover is removed the tips of the spring fingers are not exposed thus minimizing damage and danger to the customer.

BRIEF DESCRIPTION OF THE DRAWINGS

The foregoing aspects and other features of the present invention are explained in the following written description, taken in connection with the accompanied drawings, wherein;

FIG. 2 is an exploded view showing the removable side panel exposing the inside of the computer housing enclosure;

FIG. 3A is one view of the EMC grounding spring member;

FIG. 3B is a side view of the rigid member showing the shape of the openings adjacent the edge adapted to receive the EMC ground spring member of FIG. 3A;

FIG. 3C shows the EMC grounding spring member assembled with the rigid member;

DESCRIPTION OF A PREFERRED EMBODIMENT

The following detailed description is of the best presently contemplated mode for carrying out the invention. This description is not to be taken in a limiting sense but is made merely for the purpose of illustrating the general principles of the invention since the scope of the invention is best defined by the appended claims.

Figure 1:
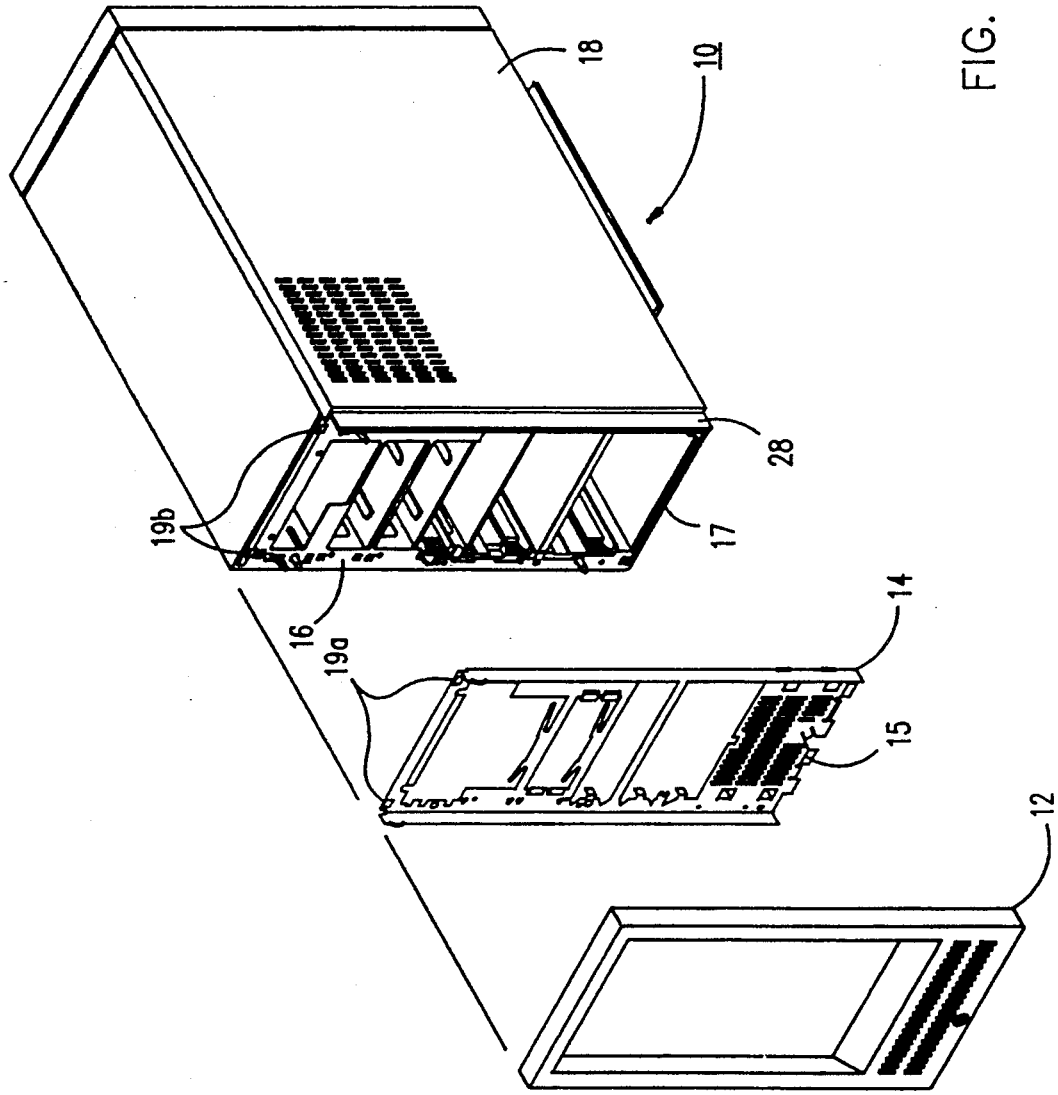
FIG. 1 illustrates an assembly view of a personal computer system showing a retainment member, a front bezel, and side panel.

Referring now to the drawings, and in particular to FIG. 1, there is shown an assembly view of a personal computer system 8 having a housing with a removable front bezel 12 and a direct access storage device (DASD) retainer 14. A front panel 16 is located on the front of the housing 10. The front panel 16 includes a plurality of DASD slots for receiving and holding disk drives or the like. The DASD retainer 14 not only provides electromagnetic compatibility for the DASD, but also securely fastens a DASD into a corresponding DASD slot. Reference is made to co-pending application Ser. No. 07/482,254 filed Oct. 27, 1989, by Cooke et al., entitled "Enclosure Apparatus for Retaining Devices Within a Computer", which is incorporated by reference.

In operation, a disk drive or the like having rails connected to the side of the unit is installed into a slot and electrically connected to the computer system. The bottom edge 15 of the DASD retainer 14 is positioned into a bottom lip 17 on the front panel 16. The DASD retainer is then rotated about the bottom and locked at the top of the front panel. The front bezel 12 includes a pair of hinges which are inserted through openings 19a and 19b on the DASD retainer 14 and front panel 16 respectively. The front bezel pivots about the hinges and swings in a general downward direction. The front bezel then fastens to the bottom of the front panel. In combination with the front bezel securing the DASD retainer in place, the front bezel includes a camming mechanism that forces side panel 18 into the edge 28 of the front panel. An EMC grounding contact spring fastening to the edge 28 forms a gasket shield to prevent electromagnetic radiation from leaking from the housing. Reference is made to FIGS. 3-11 for a detailed discussion of the above. It is also understood that the front panel 16, side panel 18, DASD retainer 14 and front bezel are comprised of electrically conductive material such as sheet metal.

Referring now to FIG. 2, there is shown an exploded view of the personal computer housing 10 with the side panel 18 being removed from the side of the housing 10. The housing 10 encloses among others, a power supply 20, a planar board 22, and a plurality of adapter cards 24 for the operation of the personal computer system. The EMC grounding spring member 26 is located along edge 28 of the front panel 16 to provide EMC shielding between the front of the unit and the side panel 18. It is important to note that the EMC grounding spring member 26 is attached by welding or other methods to the rigid edge of the front panel. A cross sectional view is shown in greater detail with respect to FIG. 5. Along the top and bottom of side member 18, the spring member 26 can be inserted in a corresponding rigid member 30 or 31 to provide EMC shielding for the top and bottom of the side member when it is assembled with the computer housing 10.

Referring to FIG. 3A, there is shown a side view of the EMC ground spring member 26. The EMC ground spring member 26 has a plurality of spring fingers 27. Each spring finger has a first surface 34 which when the spring member is attached to the rigid member 28, the first surface 34 extends outward from the surface of the rigid member 28. The first surface 34 extends into a second surface 38. The second surface 38 extends through an opening 32 in rigid member 28. The second surface forms a tab 38 having two protruding ears 40 and 42.

Referring now to FIG. 3B, there is shown a side view of the rigid edge member 28 or flange of the front panel. The rigid edge member 28 or flange has a plurality of equally spaced openings 32 which correspond in place to each of the equally spaced spring fingers 27 of the spring member 26. In use, the spring member is welded to the edge 44 of the rigid member while the spring fingers are inserted through the openings. In assembly the tab 38 is positioned inside opening 32. Since the ears 40 and 42 are less in length than the width of opening 32, the tab 38 will slide easily into the opening. The edge of the spring member is then moved towards the edge 44 of the rigid member. The fingers are automatically aligned into the openings because of the trapezoidal shape of each opening. When the spring fingers are inserted into the corresponding openings, the side of the tabs contact the side of the opening and the trapezoidal shape of the openings force the fingers to the narrowest part of the opening thus aligning the spring member fingers.

FIG. 3C shows the EMC ground spring assembly comprised of the EMC ground spring 26 being inserted into the rigid member 28. As is illustrated, spot wells 48 are used to firmly attach the EMC ground spring to the rigid member. The openings 32 are trapezoidal shaped such that when the ground spring is inserted into the openings the tab 38 fits into the widest part of the opening and as the ground spring is inserted on to the edge, the narrower part of the trapezoidal shape of the opening aligns the ground spring to the rigid member. It is important to note that the spring finger is formed so that tab 38 is forced against the inner surface of the rigid matter when the spring member is in its rest position.

Figure 4:
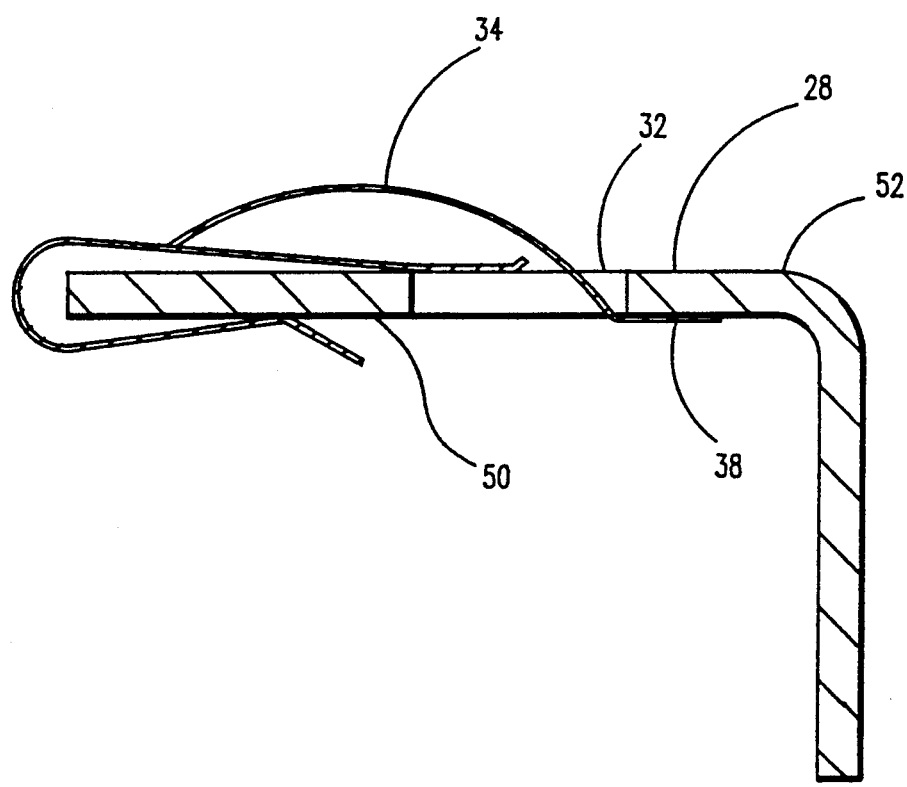
FIG. 4 shows the view of section A—A of FIG. 3C.

Referring now to FIG. 4, there is shown a view of section A—A of FIG. 3C. FIG. 4 is representative of one of the spring fingers of the EMC ground spring extending through one of the openings of the rigid member. The spring finger 26 is comprised of a first surface 34 which extends outwardly from the rigid member 28 and further extends into a second surface having a tab 38 which is retained against the inner surface of rigid member 28. The first surface 34 extends through the opening 32 and is biased to cause the tab 38 to be forced against the inner surface 50 of rigid member 28. It is important to note that FIG. 4 shows the EMC ground spring configuration at rest. It is particularly note worthy that the tab 38 is restrained against the inner surface 50 to protect the tab 38 from damage by bending.

Figure 5:
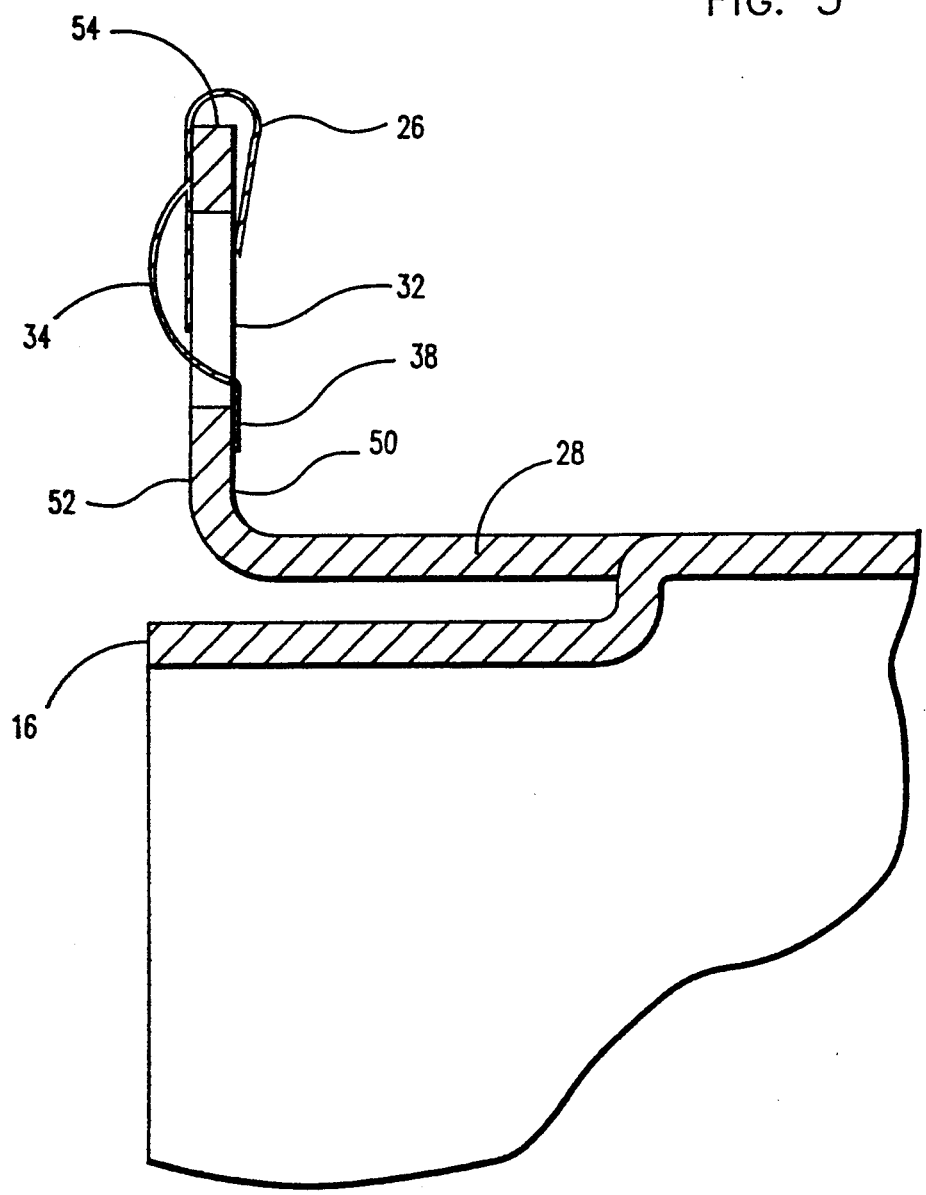
FIG. 5 shows the EMC grounding spring member with rigid member being attached to a front panel of the computer housing enclosure.

Referring now to FIG. 5, the rigid member 28 is shown connected to the front panel 16 of the base assembly of the computer housing 10. The rigid member 28 is rigidly attached to the front panel by welding or other fastening means. The ground spring 26 is fastened around to the outer edge 54 of the rigid member. The outer surface 34 of the spring finger extends outwardly from the outer surface 52 of the rigid member. The first surface 34 extends through the opening 32 of the rigid member and forms a tab 38 which is restrained against the inner surface 50 of the rigid member. It is noted that FIG. 5 shows the configuration of the front portion of the computer housing without the DASD retainer or front bezel inserted thereon.

Figure 6:
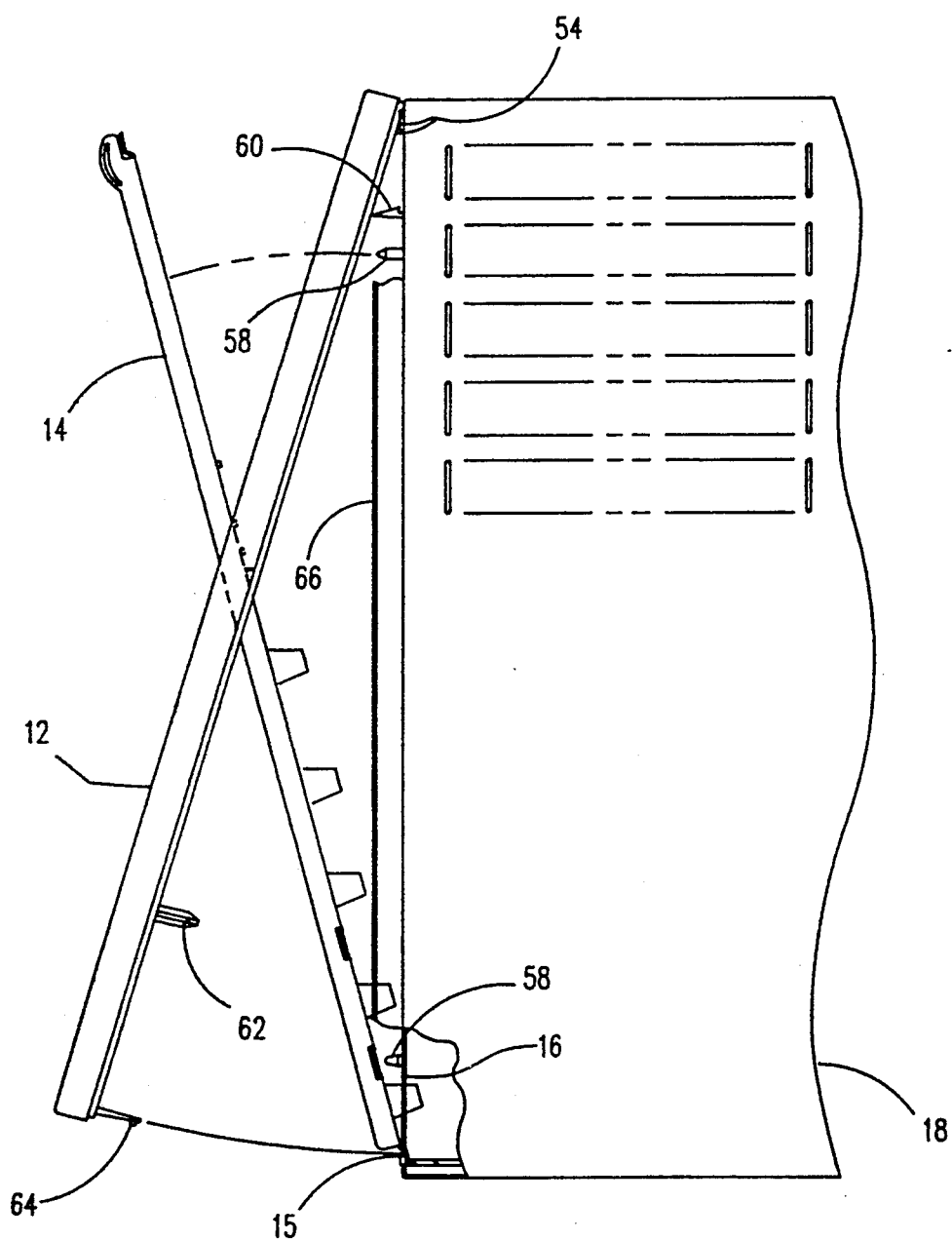
FIG. 6 illustrates the assembly of the DASD retainment member and front bezel to the front panel of the computer enclosure.

Referring now to FIG. 6, there is shown the assembly of the DASD retainer 14 and front bezel 12 on to the computer housing 10. In use, the DASD retainer 14 is first inserted on the front panel 16 of the computer housing 10 by inserting tabs 15 onto the bottom edge of front panel 16. The DASD retainer 14 then swings upwardly and is guided onto the front panel 16 by guidepost 58. The DASD retainer 14 locks to the front panel 16 by locking snap mechanism 60. After the DASD retainer 14 is attached to the front panel 16, the front bezel 12 is inserted onto the assembly by inserting hinges 54 into apertures on the DASD retainer 14 and front panel 16. The front bezel 12 then swings in a generally downward direction to lock at the bottom of front panel 16 by locking snap mechanism 64. A guide pin 62 guides the panel onto the assembly of the DASD retainer 14 and the front panel 16. As will be explained later, the hinge 54 includes a cam which causes the front bezel 12 to force edge portion 66 of side panel 18 against the EMC ground spring assembly not shown in this figure.

Figure 7:
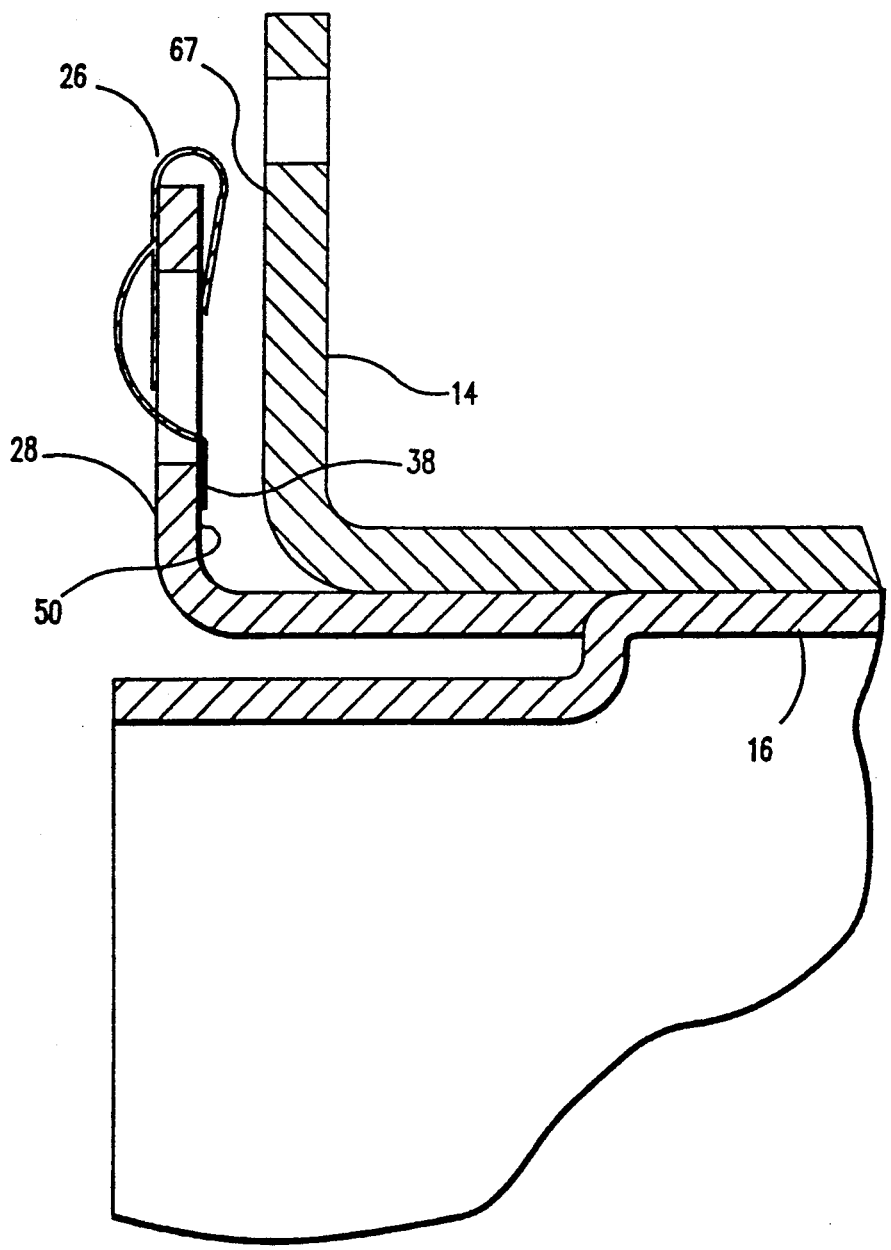
FIG. 7 shows the EMC grounding spring member attached to the rigid member with the DASD retainment member fastened to the computer housing enclosure.

Referring now to FIG. 7, there is shown the assembly of the view of FIG. 5 with the DASD retainer 14 positioned on the front panel 16. The contact spring member is shown at the retracted position and it is noted that the tab 38 is positioned against the inner surface 50 parallel to the outer surface 67 of the DASD retainer 14.

Figure 8:
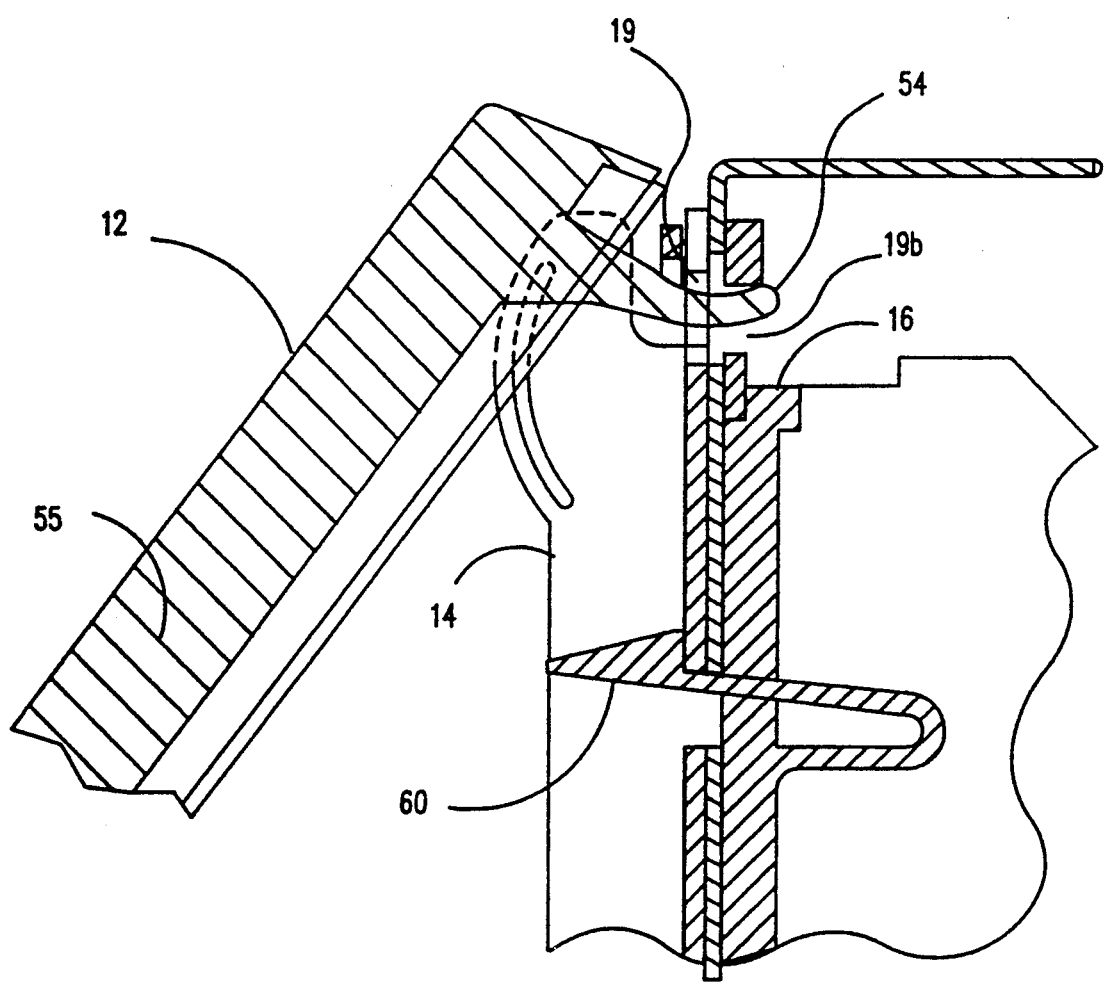
FIG. 8 illustrates a detailed sectional view of the upper DASD retainment member and upper front bezel.

Continuing our discussion with reference to FIG. 8, there is shown a detailed sectional view of the upper DASD retainment assembly. The DASD retainer 14 is held in position by fastening means 60. The hinge 54 of the front bezel 12 is inserted through aperture 19a of the DASD retainer 14 and into the aperture 19b within front panel 16. The hinge 54 includes a camming means such that when the front bezel is moved into a closed position, the side 55 of the front bezel 12 applies force to the edge or flange of the side panel to cause the spring fingers to make contact as will be explained with reference to FIG. 10.

Figure 9:
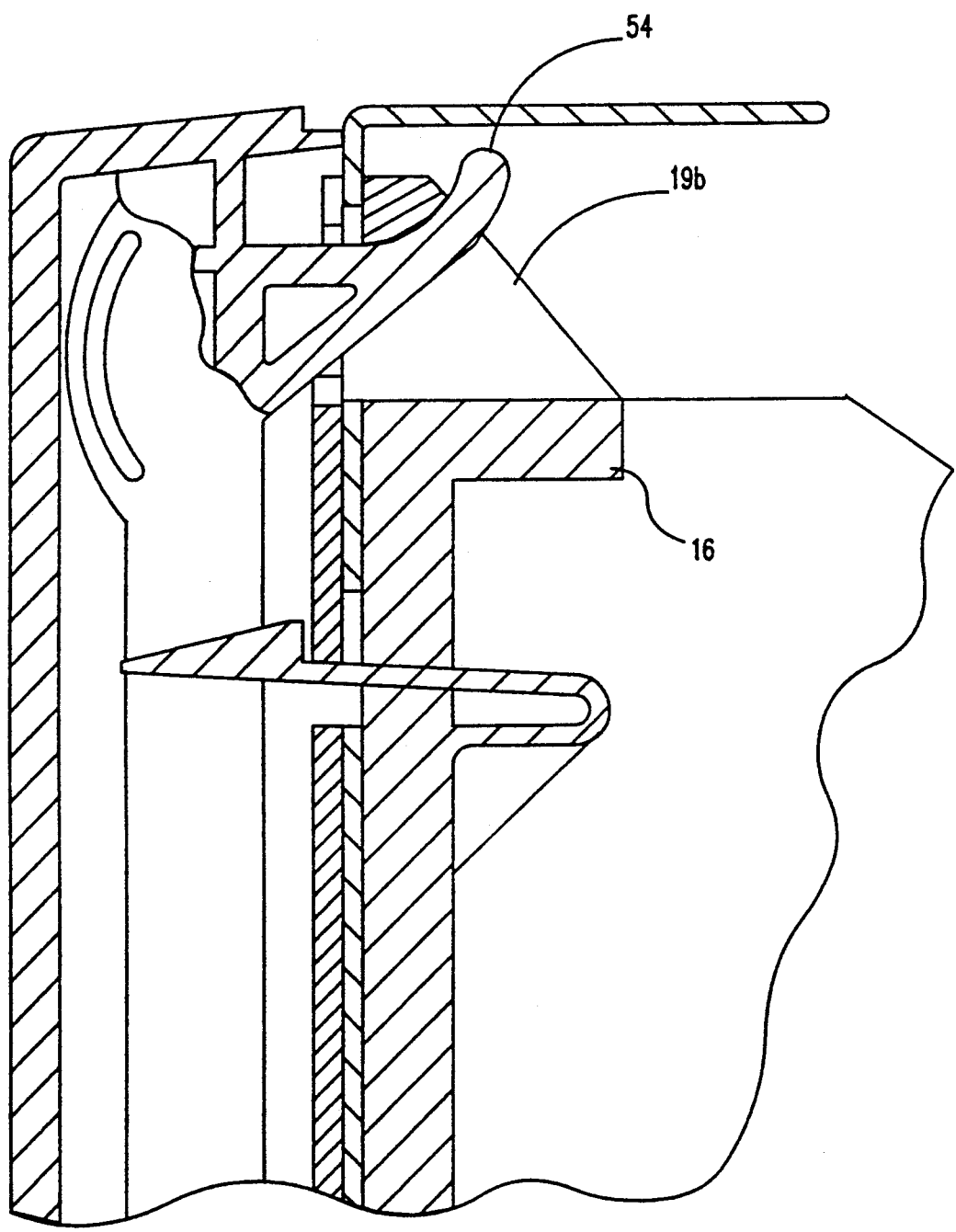
FIG. 9 is the same view as FIG. 8 with the front bezel locked in place.

Referring briefly to FIG. 9, FIG. 9 shows the front bezel 12 in the closed and locked position covering the DASD retainer 14. In this position the front bezel in combination with the DASD retainer holds the DASDs securely in their corresponding slots. Also in this position the contact spring member is engaged to prevent EMI from inside the enclosure.

Figure 10:
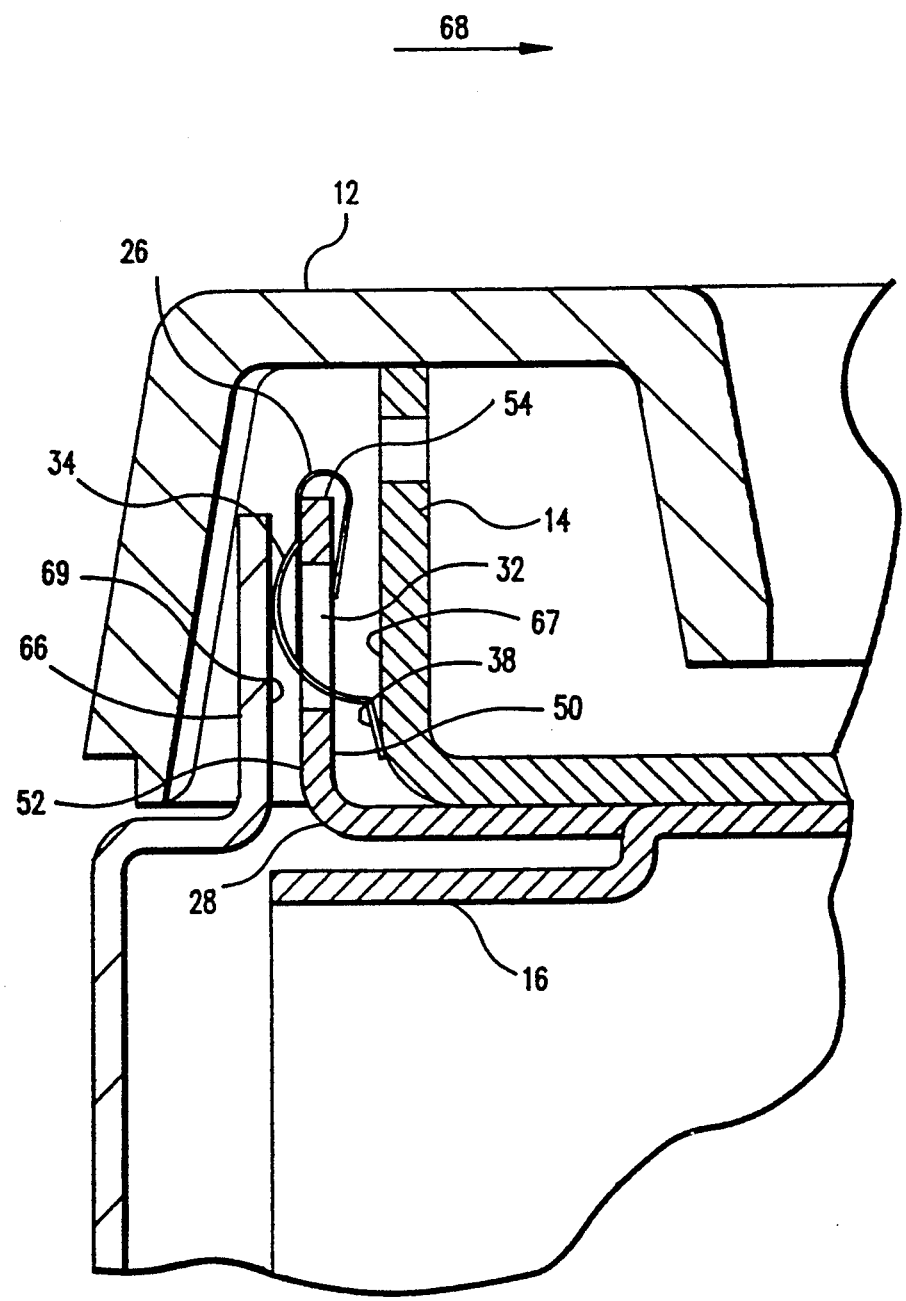
FIG. 10 is a cross sectional view of FIG. 9 showing the side panel, front panel, DASD retainment member, rigid member, and EMC grounding spring member.

Referring now to FIG. 10, there is shown a cross sectional view of FIG. 9 illustrating the DASD retainment and front bezel assembly. The front bezel 12 in operation forces the edge portion or flange 66 of side panel 18 against the first surface 34 of spring finger 26. The direction of movement of the front bezel 12 is shown by the direction of arrow 68. The front bezel forces the edge portion 66 against the first surface 34 which forces the tab 38 extending through the opening 32 into the flange or inner surface 67 of the DASD retainer 14. Since the spring finger is made of electrically conductive material, the spring finger forms a ground shield between side panel 18 and the DASD retainer 14 and front panel 16. It is important to note that when the front bezel 12 is locked into position, that the cam action of the hinge of the front bezel causes the front bezel to move in the direction as indicated by arrow 68 to force the side panel 18 against the spring finger which forces the tab 38 of the spring finger against the DASD retainer 14. In general, the first housing member 18 and second housing member 14 have a gap between them. The relatively rigid member 28 is interposed between the first housing member 18 and the second housing member 14. The rigid member 28 has an outer surface 52 opposed the inner surface 69 of the first housing member 18. The rigid member 28 has an inner surface 50 opposed the outer surface 67 of the second housing member 14. The rigid member 28 has an edge 54 and a pluralities of openings 32 adjacent the edge. The contact spring member 26 is attached to the edge 54 of the rigid member 28. The contact spring member has a plurality of individual spring fingers. Each spring finger has a first surface 34 extending away from the outer surface 52 of the rigid member 28. The first surface 34 extends through the opening 32 into a second surface 38. The second surface 38 is positioned against the inner surface of the rigid member in the retracted position. When the front bezel 12 is inserted on the assembly, a camming means of the front bezel member 12 forces the first member 18 towards the second member 14 to close the gap. The first member contacts the first surface 34 of the spring finger to force the second surface 38 away from the inner surface 50 of the rigid member 28 and into the second housing member 14 to create an electrical connection between the first housing member 66 and the second housing member 14.

Figure 11:
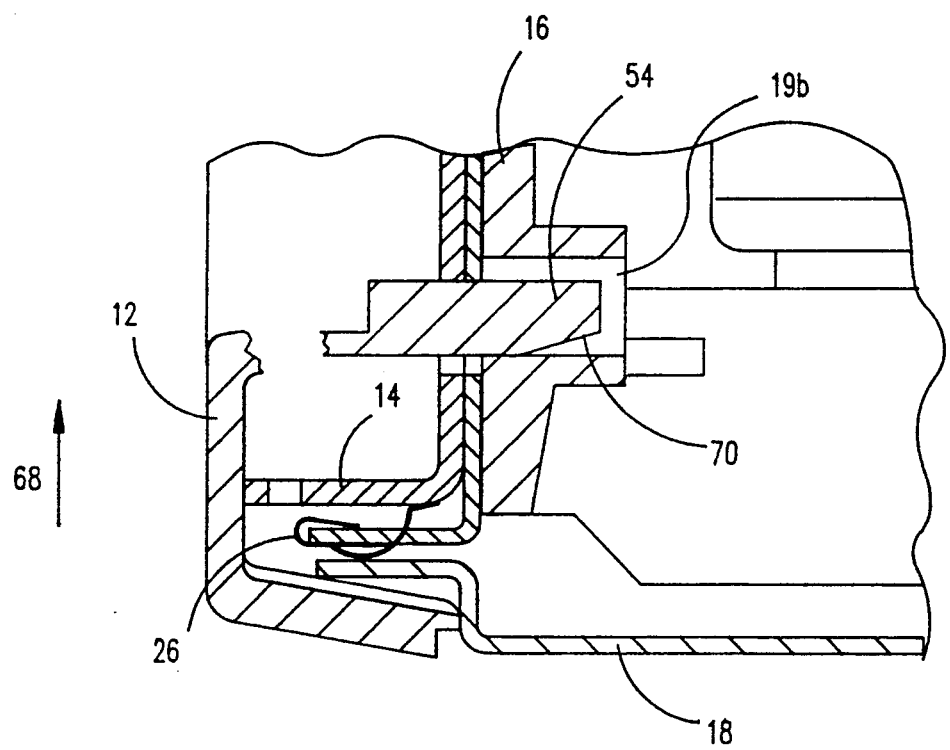
FIG. 11 illustrates the camming action of the front bezel hinge to force the side panel against the EMC grounding spring member into the DASD retainment member.

Continuing our discussion with reference to FIG. 11, there is shown a cross sectional top view of the hinge 54 with the camming means in the form of a cam surface 70. The hinge 54 is physically connected to the front bezel 12. In operation, when the hinge 54 is inserted into the opening 19b of the front panel 16, the cam surface 70 causes the front bezel to move in the direction of arrow 68. As was explained with reference to FIG. 10, the movement of the front bezel in the direction 68 causes the front bezel to force the side panel 18 into the contact spring 26 which creates an electrical connection between the DASD retainer 14 and the side panel 18.

Thus there has been shown an electromagnetic device for shielding a housing for electronic equipment having a first and second housing member with a gap between them. A relatively rigid member interposed between the first and second housing member has an outer surface oppose the first housing member and an inner surface oppose the second housing member. The rigid member has an edge and plurality of openings adjacent the edge. A contact spring member is attach the edge of the rigid member and the contact spring member has a plurality of individual spring fingers. Each individual spring fingers has a first surface extending away from the outer surface of the rigid member. The first surface extends into a second surface extending through said opening and being in position against the inner surface of said rigid member in the rest position. A cover member encloses a portion of the first member and forces a portion of the first member towards the second member to close the gap. The first member contacts the first surface of each individual spring finger to force the second surface away from the inner surface of the rigid member and into the second housing member to create an electrical connection between the first and the second housing members.

The above described embodiment of the invention is illustrative only, and that modifications thereof may occur to those skilled in the art. Accordingly, this invention is not to be regarded as limited to the embodiment disclosed herein, but is to be limited as defined by the appended claims.

We claim:

1. Apparatus for electromagnetically shielding electronic equipment comprising:
    first and second spaced apart housing members and means defining a gap there between;
    an interposer between said means defining said gap;
    a spring member on said interposer and having portions thereof facing and extending towards said means defining said gap;
    and a cover member for embracing said means defining said gap, and cam means associated with said cover member to effect closure of said gap to bias said first and second housing members against said spring member.

2. Apparatus in accordance with claim 1 wherein at least said means defining said gap and said spring member are composed of a conductive medium to create an electrical connection between said first and second housing members.

3. Apparatus in accordance with claim 1 wherein said means defining a gap comprises a first flange extending from said first member and a second flange, spaced from said first flange, and extending from said second member.

4. An apparatus for electromagnetically shielding electronic equipment comprising:
    first and second spaced apart housing members and means defining a gap there between;
    an interposer between said means defining said gap;
    a spring member on said interposer and having portions thereof facing and extending towards said means defining said gap;
    and a cover member for embracing said means defining said gap, and cam means associated with said cover member to effect closure of said gap to bias said first and second housing members against said spring member; wherein
    said interposer comprises a flange disposed within said gap; and a plurality of longitudinally spaced apart apertures extending through said flange; and fingers on said spring member extending through said apertures for contact with said housing members.

5. An electromagnetic device for shielding a housing for electronic equipment comprising:
    a first and second housing members having a gap between them;
    a relatively rigid member interposed between said first and second housing members, said rigid member having an outer surface opposed said first housing and an inner surface opposed said second housing, said rigid member having an edge and a plurality of openings adjacent the edge;
    a contact spring member attached to the edge of said rigid member, said contact spring member having a plurality of individual spring fingers, each spring finger having a first surface extending away from the outer surface of said rigid member, said first surface extending into a second surface extending through said opening and being positioned against the inner surface of said rigid member in the rest; and
    a cover member enclosing a portion of said first member, said cover member forcing said portion of said first member towards said second member to close the gap, said first member contacting the first surface of each individual spring finger to force said second surface away from the inner surface of said rigid member and into said second housing member to create an electrical connection between said first and second housing members.

6. The apparatus in accordance with claim 5, wherein said spring member is composed of a conductive medium to create an electrical connection between said first and second housing members.

7. An apparatus for electromagnetically shielding electronic equipment comprising:
    first and second spaced apart housing members and means defining a gap there between;
    an interposer between said means defining said gap;
    a spring member on said interposer and having portions thereof facing and extending towards said means defining said gap;
    cam means associated with a cover member to effect closure of said gap to bias said first and second housing members against said spring member.

8. Apparatus in accordance with claim 7 wherein at least said means defining said gap and said spring member are composed of a conductive medium to create an electrical connection between said first and second housing members.

9. Apparatus in accordance with claim 7 wherein said means defining a gap comprises a first flange extending from said first member and a second flange, spaced from said first flange, and extending from said second member.

10. An apparatus for electromagnetically shielding electronic equipment comprising:
    first and second spaced apart housing members and means defining a gap there between;
    an interposer between said means defining said gap;

a spring member on said interposer and having portions thereof facing and extending towards said means defining said gap;
cam means associated with a cover member to effect closure of said gap to bias said first and second housing members against said spring member; wherein
said interposer comprises a flange disposed within said gap; and a plurality of longitudinally spaced apart apertures extending through said flange; and fingers on said spring member extending through said apertures for contact with said housing members.

* * * * *